United States Patent [19]
Dockerty et al.

[11] Patent Number: 6,053,394
[45] Date of Patent: Apr. 25, 2000

[54] COLUMN GRID ARRAY SUBSTRATE ATTACHMENT WITH HEAT SINK STRESS RELIEF

[75] Inventors: Robert Charles Dockerty, Austin; Ronald Maurice Fraga, Pflugerville; Ciro Neal Ramirez, Round Rock, all of Tex.; Sudipta Kumar Ray, Wappingers Falls, N.Y.; Gordon Jay Robbins, Austin, Tex.

[73] Assignee: International Business Machines Corporation, Armonk, N.Y.

[21] Appl. No.: 09/006,411

[22] Filed: Jan. 13, 1998

[51] Int. Cl.[7] ..................................... B23K 31/02
[52] U.S. Cl. ..................... 228/180.22; 228/189; 228/226
[58] Field of Search ..................... 228/180.21, 180.22, 228/225, 226, 189; 257/737, 738

[56] References Cited

U.S. PATENT DOCUMENTS

| | | |
|---|---|---|
| 3,871,015 | 3/1975 | Lin et al. .................................. 357/67 |
| 3,932,934 | 1/1976 | Lynch et al. . |
| 4,413,308 | 11/1983 | Brown . |
| 4,509,096 | 4/1985 | Baldwin et al. . |
| 4,604,644 | 8/1986 | Beckham et al. . |
| 4,664,309 | 5/1987 | Allen et al. . |
| 4,705,205 | 11/1987 | Allen et al. . |
| 4,878,611 | 11/1989 | LoVasco et al. . |
| 4,914,814 | 4/1990 | Behun et al. ............................. 29/843 |
| 4,927,697 | 5/1990 | Ihill . |
| 5,001,829 | 3/1991 | Schelhorn . |
| 5,088,007 | 2/1992 | Missele . |
| 5,108,027 | 4/1992 | Warner et al. .......................... 228/254 |
| 5,222,014 | 6/1993 | Lin . |
| 5,233,504 | 8/1993 | Melton et al. . |
| 5,251,806 | 10/1993 | Agarwala et al. . |
| 5,324,892 | 6/1994 | Granier et al. . |
| 5,349,495 | 9/1994 | Visel et al. . |
| 5,397,921 | 3/1995 | Karnezos . |
| 5,400,950 | 3/1995 | Myers et al. . |
| 5,498,903 | 3/1996 | Dixon et al. . |
| 5,541,450 | 7/1996 | Jones et al. . |
| 5,551,627 | 9/1996 | Leicht et al. ........................ 228/180.22 |
| 5,639,696 | 6/1997 | Liang et al. ............................. 437/209 |
| 5,641,990 | 6/1997 | Chiu ......................................... 257/737 |
| 5,675,183 | 10/1997 | Swamy et al. .......................... 257/723 |
| 5,718,367 | 2/1998 | Covell, II et al. ...................... 228/254 |
| 5,821,161 | 10/1998 | Covell, II et al. ...................... 438/613 |
| 5,881,944 | 3/1999 | Edwards et al. ...................... 228/56.3 |
| 5,881,945 | 3/1999 | Edwards et al. ..................... 228/124.6 |

OTHER PUBLICATIONS

IBM Technical Disclosure Bulletin, vol. 32, No. 8A, Jan. 1990, "Latchless Pneumatic Impact Actuator", pp. 483–486.
IBM Technical Disclosure Bulletin, vol. 38, No. 02, Feb. 1995, "Surface Mount Heat Sink for Solder Ball Connect Modules and C4 Chip to Card Attach", p. 419.

*Primary Examiner*—Patrick Ryan
*Assistant Examiner*—Kiley Stoner
*Attorney, Agent, or Firm*—Casimer K. Salys

[57] ABSTRACT

Structure and method for reinforcing a solder column grid array attachment of a ceramic or the like substrate to a printed circuit board, the reinforcement providing support for a heat sink which is bonded or affixed by pressure to a structural element of the substrate. In one form, the invention involves the concurrent formation of materially larger solder columns along the perimeter of the substrate in conjunction with the array of thin electrically interconnecting solder columns on the substrate. The reinforcing and electrical signal columns are thereafter aligned and attached by solder reflow to a corresponding pattern of pads on the printed circuit board. The heat sink is thermally connected to a structural element of the substrate by bonding or mechanical compression. Stresses in the solder columns caused by heat sink compressive forces or vibration induced flexing are materially decreased without adding complex or unique manufacturing operations.

10 Claims, 4 Drawing Sheets

COLUMN GRID ARRAY SUBSTRATE ATTACHMENT WITH HEAT SINK STRESS RELIEF

FIELD OF THE INVENTION

The present invention is directed to column array connections attaching modules or chips, generally substrates, with low coefficients of thermal expansion to printed circuit boards having materially higher coefficients of thermal expansion. More particularly, the present invention is directed to structural refinements suitable to reinforce the substrates for applications requiring heat sinks or the like.

BACKGROUND OF THE INVENTION

Integrated circuit packages and their applications have undergone tremendous change in evolving to what is presently considered a contemporary design. Integrated circuit die (chip) sizes having increased dramatically, as have their operational clock rates. At the same time both the active and passive integrated circuit device dimensions have decreases. The circuit functions available from each integrated circuit die are now materially greater. As a consequence of such trends, integrated circuit packages require greater pin-out counts and higher power dissipation capabilities.

Numerous of the performance objectives were satisfied with ball grid array technology, including both the flip-chip and ceramic package variants. The power dissipation problem was addressed through the use of miniature heat sinks which attach directly to the flip-chip or ceramic package.

Simulation and testing of ball grid array type solder attachments involving silicon die or ceramic packages and underlying FR4 or the like fiberglass printed circuit boards has uncovered a susceptibility to stress failures. The failures occur with thermal cycling and are attributable to the materially different coefficients of thermal expansion. The stresses experienced by the ball grid array solder connections are aggravated with package size and with forces introduced by bonded or compressively affixed heat sinks. Moreover, the number of thermal stress cycles, and associated fatigue failure rates, have increased materially with the introduction of die power management techniques which frequently cycle the die between sleep and full operation modes.

A very new connection technology capable of managing the strain caused by the mismatch in coefficients of thermal expansion involves the use of solder columns, rather than solder balls, to define the electrical connections between the ceramic or die and the printed circuit board. Typical columns have an aspect ratio of approximately 9:2 and a nominal diameter of 0.020 inches. The solder columns are formed from high melting temperature solder using a nominal 90/10 alloy of lead to tin. The columns are first bonded to the ceramic or die, and thereafter attached to the printed circuit board using conventional low melting temperature solder paste reflow techniques.

As the power dissipation of flip-chip and ceramic packaged integrated circuits have increased, now often exceeding 50 watts, the heat sink has become critical necessity. Whether the heat sink is attached to the substrate by mechanical clamping, or by bonding, or the combination, the shock, vibration and pressure effects of heavy heat sinks are more than column array solder connections alone can support.

One approach to reinforcing the solder column connections of ceramic package substrates involves the placement of Kovar or Cusil pins in the corners of the ceramic packages to maintain the position of the ceramic package in relation to the printed circuit board in the presence of the heat sink vibrations and compressive forces. Such pins are attached to the ceramic substrate by brazing. The pins are then positioned into holes in the printed circuit board. Unfortunately, the use of such pins results in numerous additional and unique manufacturing steps. Furthermore, their use is effectively limited to ceramic packages, not for flip-chip die attachments.

In view of the foregoing, there exists a need for both structures and methods by which integrated circuits, whether in flip chip die or ceramic packages, can be attached through a solder column grid array adequately to support a heat sink.

SUMMARY OF THE INVENTION

The present invention is practiced in the context of a system for connecting a substrate having a low coefficient of thermal expansion to a printed circuit board having a materially higher coefficient of thermal expansion using an array of solder columns and reflow bonding. In that context, the invention supports the substrate to permit effective heat sink contact with a structural element of the substrate, comprising an array of high melting temperature solder columns of first cross-sectional area attached to an array of electrically transmitting pads on the substrate, a set of high melting temperature solder columns of second cross-sectional area, the second cross-sectional area exceeding the first by a factor of 5 or greater, attached to pads at perimeter locations of the substrate, a plurality of connections between first and second cross-sectional area solder columns and respective pads on the printed circuit board using reflowed low temperature solder, and a heat sink thermally contacting a structural element of the substrate on a side opposite the solder column attachments.

In another form, the invention is directed to a process practiced in the context of a system for connecting a substrate having a low coefficient of thermal expansion to a printed circuit board having a materially higher coefficient of thermal expansion using an array of solder columns and reflow bonding, the method providing supports for the substrate to permit effective heat sink contact with a structural element of the substrate, comprising the steps of attaching an array of high melting temperature solder columns of first cross-sectional area to an array of electrically transmitting pads on the substrate, attaching a set of high melting temperature solder columns of second cross-sectional area, the second cross-sectional area exceeding the first by a factor of five or greater, to pads at perimeter locations of the substrate, reflowing low temperature solder to connect first and second cross-sectional area solder columns to respective pads on the printed circuit board, and connecting by thermal contact a heat sink to a structural element of the substrate on the side opposite the solder column attachments.

In a particularized form, the invention extends and refines the basic practice of using an array of solder columns to attach a substrate, whether that substrate is an integrated circuit die directly or a die mounted within a ceramic package, to a printed circuit board employing solder paste and conventional reflow techniques. Relatively lower aspect ratio solder columns are formed in the corners or other peripheral regions of the substrate, in conjunction with the formation of the thin solder column electrical interconnect array, using corresponding high melting temperature solder. The conventional and reinforcing columns are bonded to the substrate simultaneously using either a wire column attachment process or a cast column attachment process.

The substrate and attached columns are aligned with the pads on the printed circuit board using conventional fixtures. Likewise, bonding of the substrate to the printed circuit board as to both the reinforcing columns and conventional electrical signal column array is accomplished by reflowing solder paste deposited on the printed circuit board pads. Once the substrate is bonded to the printed circuit board, the reinforcing columns support the substrate and any attached heat sink. The reinforcing solder columns maintain spacing and structural integrity in presence of vibration and temperature variations.

These and other features of the invention will be more clearly understood and appreciated upon considering the detailed embodiments described hereinafter.

DESCRIPTION OF THE PREFERRED EMBODIMENT

Figure 1:
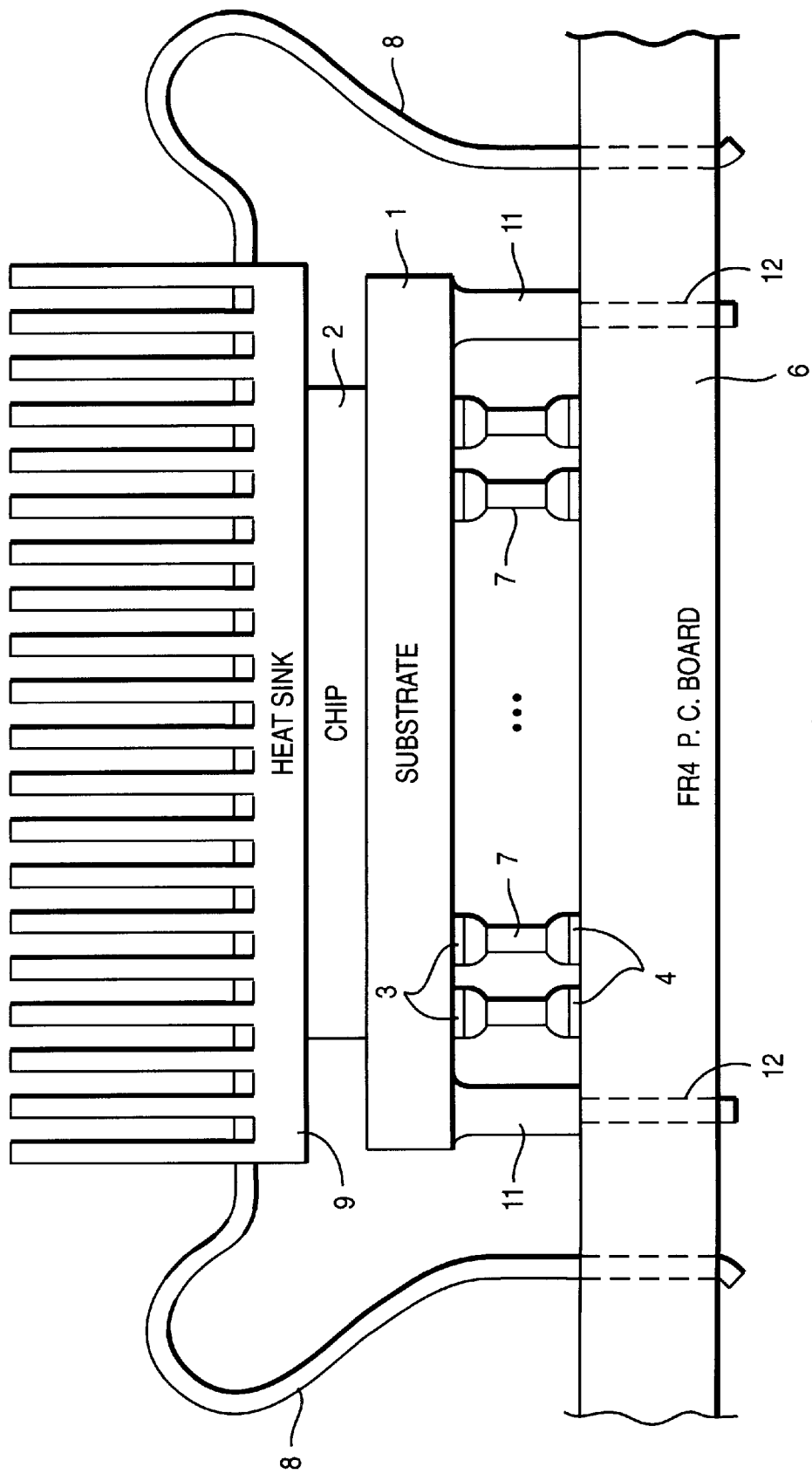
FIG. 1 schematically depicts a side view of a prior art substrate and heat sink attachment using pins for structural support.

FIG. 1 schematically illustrates the prior art relating to the structural support for a substrate connected by a solder column array to a printed circuit board when configured with a heat sink. As illustrated in the figure, ceramic substrate 1 has bonded thereto integrated circuit die (commonly also referred to as a chip) 2, chip 2 representing an individual integrated circuit die or a capped integrated circuit device. Electrically conductive pads 3 and 4, respectively formed on substrate 1 and FR4 type fiber glass printed circuit board 6, define the pattern of the solder column array for electrical input/output connections between substrate 1 and printed circuit board 6. The connections between respective pads 3 and 4 are accomplished using solder columns 7.

Solder column 7 are preferably formed from a 90/10 alloy of lead/tin solder, namely, high melting temperature solder, with a nominal height in the range of 0.08 inches and a nominal diameter of 0.02 inches. Solder columns 7 are attached to pads 3 of substrate 1 using either of two techniques. One process involves a high temperature reflow of the 90/10 solder columns, with the columns mounted as an array in a boat which is affixed to the substrate. An alternate technique involves the use of a low temperature solder paste deposited onto pads 3, followed by a low temperature reflow of the paste. The lower melting temperature solder, nominally 37/63 alloy lead/tin bonds an array of 90/10 solder columns which are mounted in a supporting boat to the substrate pads. Both techniques have been in commercial use.

The materially different coefficients of thermal expansion exhibited by substrate 1 and printed circuit board 6 are within the flexing capabilities of solder columns 7 given the relative aspect ratio of the columns. Unfortunately, that aspect ratio makes the columns vulnerable to compressive and/or lateral forces, such as those created by spring 8 and any movement of heat sink 9. Since the thermal resistance between heat sink 9 and chip 2 is inversely related to the clamping pressure, the structural limitations of solder columns 7 also constrain the ability to effectively cool chip 2 when heat transfer is initiated by spring 8.

The solution developed heretofore, was to allow greater clamping pressure by using corner pins 11. Pins 11 are composed of kovar or cu-sil, exhibit a high compressive strength, and have minimal creep in relation to solder columns 7. Pins 11 are bonded to substrate 1 by brazing and extend into holes 12 drilled through printed circuit board 6. Unfortunately, the use of such pins to support substrate 1 requires the additional manufacturing steps to braze attach pins 11, drill holes 12 in printed circuit board 6, and to align pins 11 with holes 12 when mounting substrate 1. The rigidity of the elements involved mandates very tight tolerances for the location of pins 11 and holes 12.

The present invention eliminates the additional manufacturing steps and tolerance requirements by extending the basic column attachment process to further support substrate 1, especially in the presence of heat sink 9. The invention is applicable to situations in which substrate 1 is the ceramic base associated with chip 2, wherein chip 2 may be capped or exposed. For a flip-chip application, chip 2 is bonded to substrate 1 using solder bumps. Though heat sink 9 in FIG. 1 is shown compressively affixed to a structural element, chip 2 of the substrate using spring 8, the invention is also applicable to situations in which the heat sink is bonded directly to a structural element of the substrate, or is compressively connected to such structural element using a mechanically adjustable clamp. Key to the invention is the ability to materially increase the structural integrity of the interface between substrate 1 and printed circuit board 6 for shock and vibration environments within the framework of conventional solder column fabrication practices.

Figure 2:
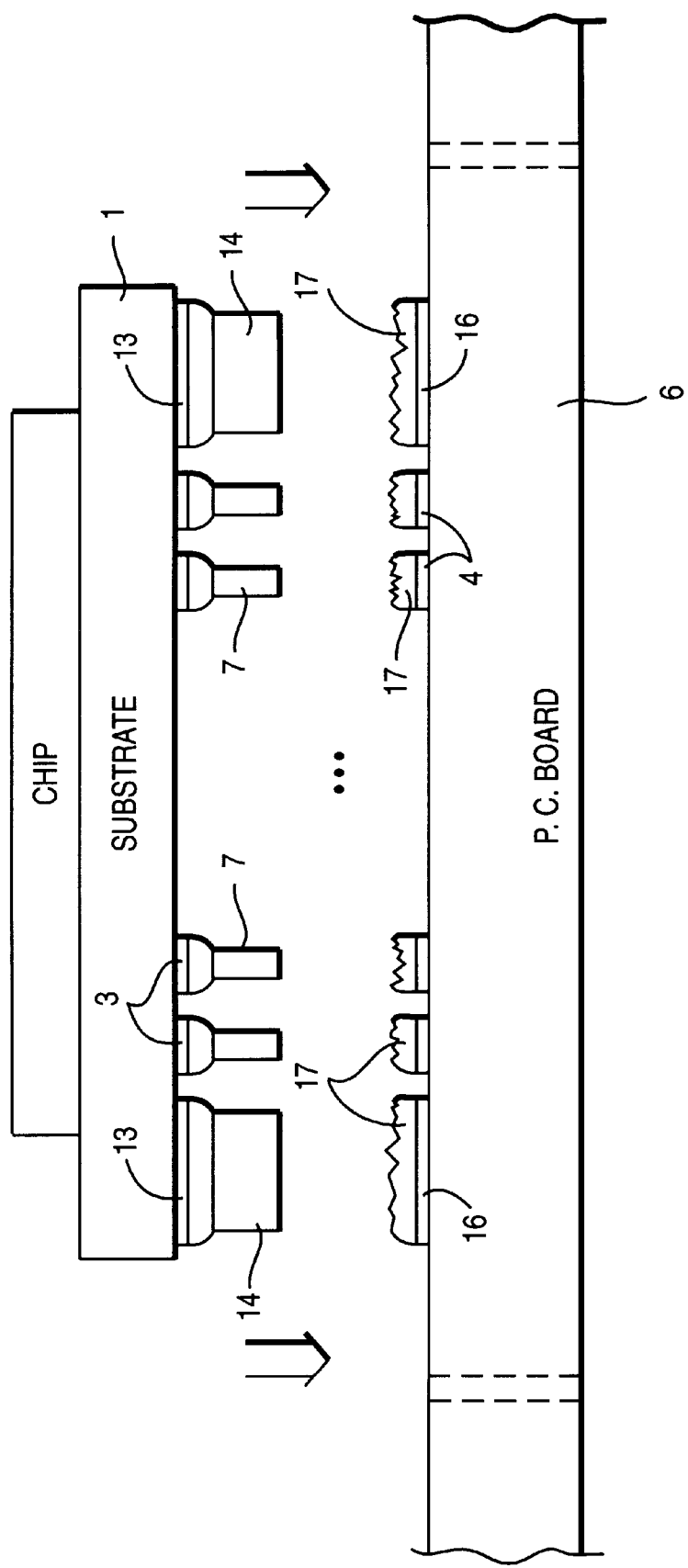
FIG. 2 is a schematic illustrating the connection of a substrate to a printed circuit board using reinforcing solder columns according to the present invention.
Figure 3:
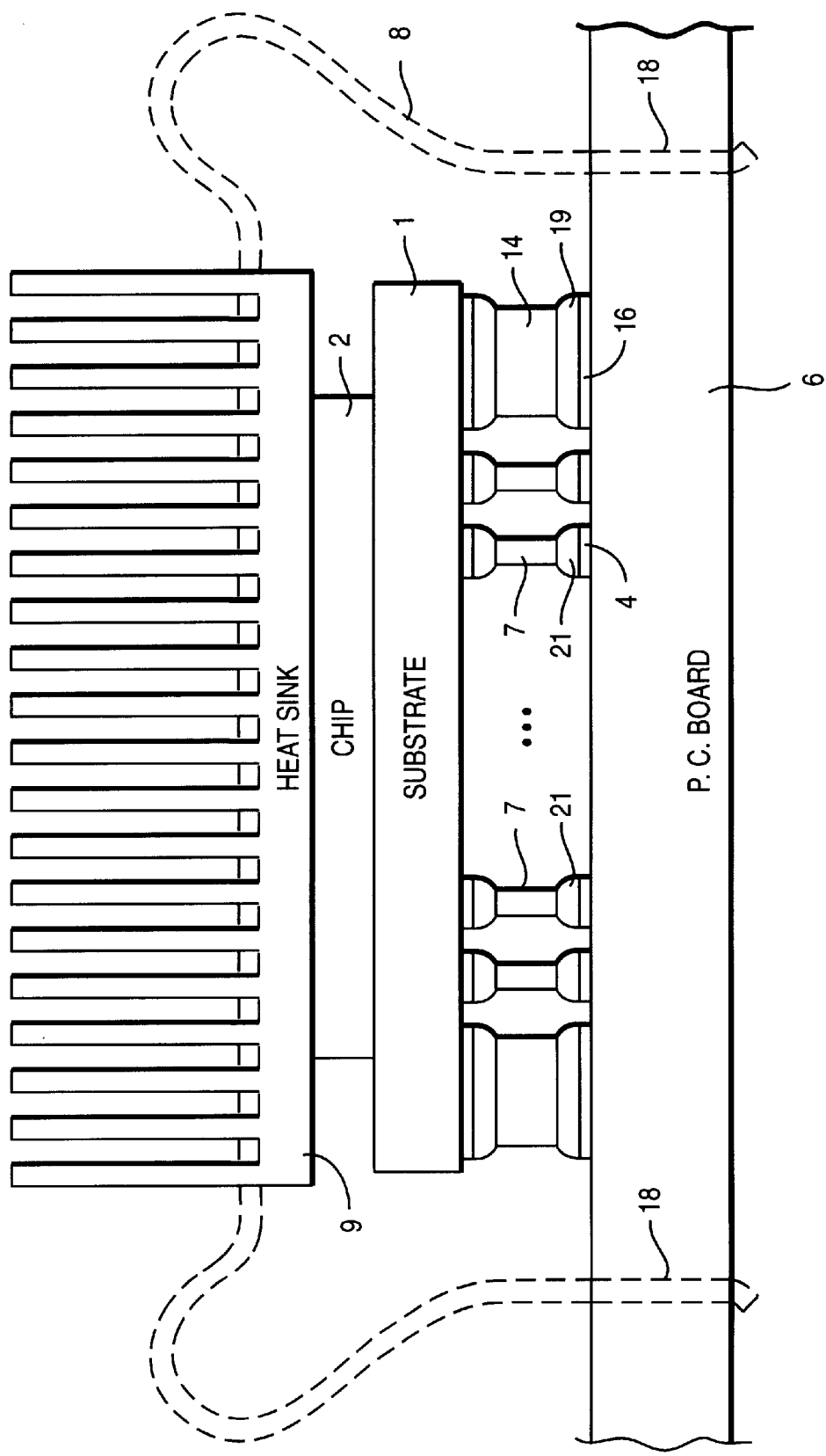
FIG. 3 is a schematic showing a substrate attached with reinforcing columns to a printed circuit board and having a heat sink thermally contacting a structural element of the substrate.

FIGS. 2 and 3 illustrate the aspects of the present invention in connecting substrate 1 to printed circuit board 6. As shown in FIG. 2, pads 3 of substrate 1 each have a solder column 7 attached by solder reflow. However, in keeping with the present invention, substrate 1 also includes pads 13 situated along the perimeter of substrate 1, typically in the corners of the substrate, which have attached thereto individual solder columns 14. Columns 14 are composed of high melting temperature solder, for example the earlier noted 90/10 alloy, and are attached when electrical signal columns 7 are bonded to pads 3 of substrate 1. Solder columns 14 along the perimeter of substrate 1 provide the structural support while the array of solder columns 7 provide the high density electrical connections. Preferably, columns 14 are in the range of 0.08 inches or greater in diameter while matching the height of columns 7.

The connection of columns 7 and 14 to corresponding pads 4 and 16 on printed circuit board 6 is accomplished by reflow of low melting temperature solder paste 17 after the columns 7 and 14 are positioned in solder paste. Solder paste 17 is composed of flux and nominal 37/63 composition lead/tin solder having a melting temperature of approximately 180 degrees C.

FIG. 3 schematically illustrates the structural arrangement after heat sink 9 is mounted. Heat sink 9 can be held in place using spring 8 extending through holes 18 in printed circuit board 6, or by direct bonding between heat sink 9 and chip 2 using thermal epoxy material. Support and spacing solder columns 14 are bonded to printed circuit board pads 16 by reflowed solder 19 while the array of columns 7 are electrically connected to pads 4 on printed circuit board 6 with reflowed solder 21.

Finite element simulations of a ceramic substrate with an aluminum capped chip and heat sink, attached to an FR4 type printed circuit board and subjected to various shock and vibration conditions have confirmed that the stresses imposed upon the thin solder columns are materially reduced when supporting solder columns are placed along the perimeters of the substrate. For purposes of the simulation various dimensions of supporting solder columns 14 were considered. As the support columns increased in cross-sectional area, the stresses in the thin solder columns decreased. For example, with solder columns having a height of 0.09 inches, and electrically transmitting solder columns 7 having a nominal diameter of 0.02 inches, the use of supporting solder columns having a cross-sectional area of five times the electrically transmitting solder columns caused the stress in the thin solder columns to decrease by approximately 50 percent.

What makes the present invention particularly valuable is the fact that the benefits are obtained without the added complexity of brazing pins, drilling additional holes in the printed circuit board, or aligning the pins and the holes during manufacture.

Figure 4:
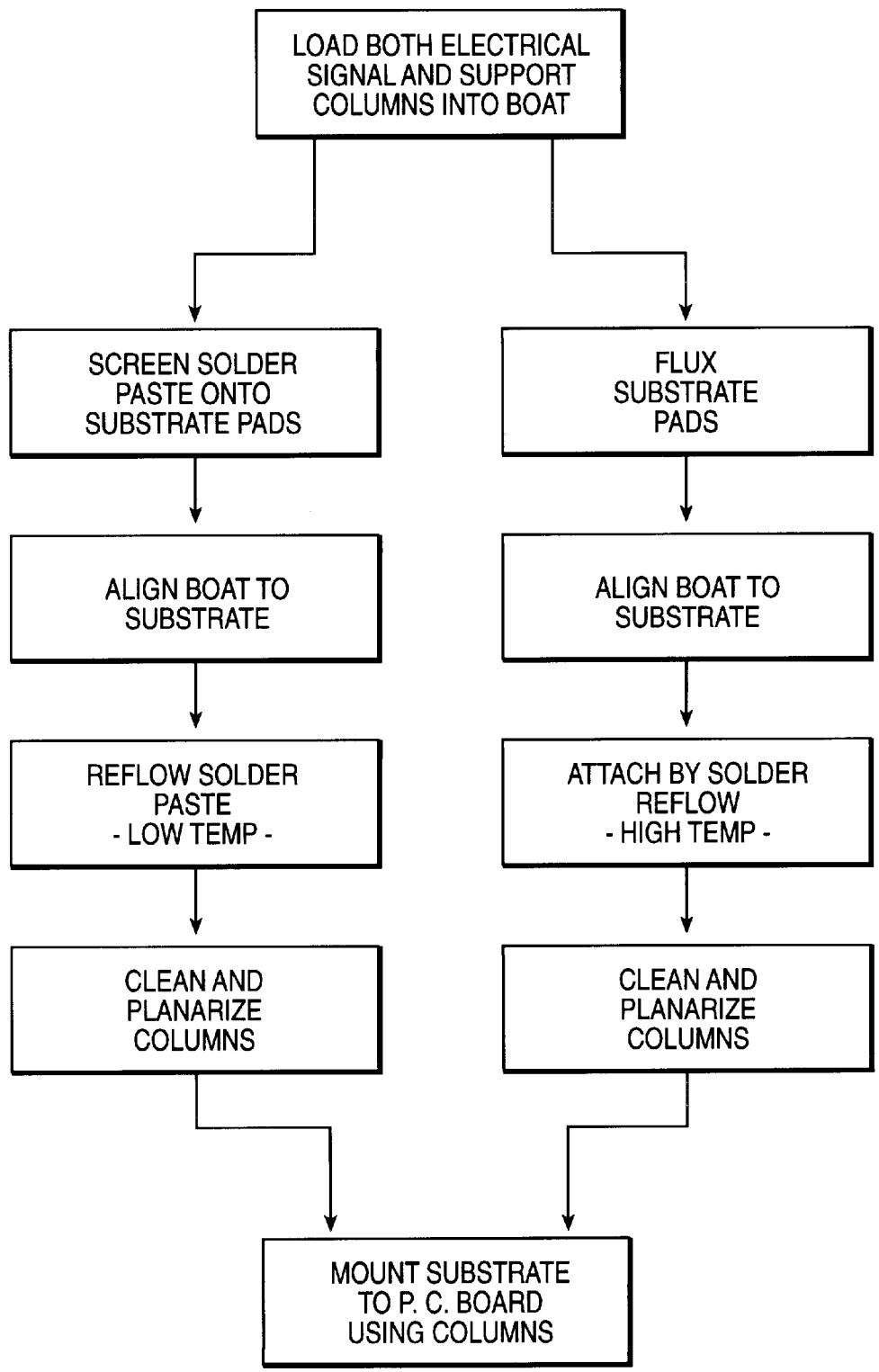
FIG. 4 schematically depicts process steps by which the invention may be practiced in two variants.

FIG. 4 schematically illustrates alternate operations for attaching solder columns to the substrate. One involves a reflow of low temperature solder paste, while the other consists of a direct reflow of the high temperature solder in each column. The descriptions in the various blocks are relatively self explanatory. In general, when low temperature solder is used to attach the solder columns to the substrate, including both the thin electrically signal solder columns and the structural supporting solder columns, all the columns are loaded in a common boat, solder paste is deposited on the substrate pads, and the solder paste is reflowed at 210–220 degrees C. On the other hand, where the solder columns themselves are reflowed as an aspect of the attachment to the substrate, the reflow is performed without solder paste but at the materially higher temperature of approximately 350–360 degrees C. Therefore, both types of solder columns are attached simultaneously both to the substrate and to the printed circuit board.

It should be understood that structural support solder columns 14 do not need to be circular in cross-section. The invention fully contemplates square or other cross-sections, as the substrate area and load conditions dictate. Similarly, as noted generally hereinbefore, chip 2 may be an actual integrated circuit die or even a capped integrated circuit die. In either case, it constitutes a structural element of substrate 1 for purposes of transferring heat to heat sink 9. Lastly, it should also be recognized that columns 14 are fully capable of transmitting electrical power or functional input/output signals, and are likely to be used for such as the pin-out needs of integrated circuit devices increase.

Although the invention has been described in the context of a substrate, typically ceramic, onto which an integrated circuit die is attached, the fundamental concepts are fully applicable to a situation in which the substrate itself is a flip-chip device. In that context the columns are bonded directly to the flip-chip die pads, and the heat sink is thermally connected to the back side of the flip-chip die. Such a flip-chip device can be connected directly to an organic printed circuit board, a ceramic carrier, or other die wiring package.

Though the invention has been described and illustrated by way of specific embodiments, it is intended that the apparatus and methods in the appended claims encompass changes within the scope of the invention is broadly disclosed.

We claim:

1. In a system for connecting a substrate having a low coefficient of thermal expansion to a printed circuit board having a materially higher coefficient of thermal expansion using an array of solder columns and reflow bonding, a method for supporting the substrate when under compression to effectuate heat sink contact with a structural element of the substrate, comprising the steps of:

attaching an array of high melting temperature solder columns of first cross-sectional area to an array of electrically transmitting pads on the substrate;

attaching a set of high melting temperature solder columns of second cross-sectional area, the second cross-sectional area exceeding the first by a factor of five or greater, to pads at perimeter locations of the substrate;

reflowing low temperature solder to connect first and second cross-sectional area solder columns to respective pads on the printed circuit board; and connecting by compressive thermal contact a heat sink to a structural element of the substrate on a side opposite the solder column attachments.

2. The method recited in claim 1, wherein the step of connecting by thermal contact between the heat sink and the structural element of the substrate is accomplished by bonding.

3. The method recited in claim 2, wherein high melting temperature solder is nominally 90/10 of lead/tin.

4. The method recited in claim 3, wherein second cross-sectional area solder columns are connected to transmit electrical signals between the pads on the substrate and on the printed circuit board.

5. The method recited in claim 4, wherein low melting temperature solder is nominally 37/63 of lead/tin.

6. The method recited in claim 1, wherein the step of connecting by thermal contact between the heat sink and the structural element is accomplished by mechanical compression.

7. The method recited in claim 6, wherein the mechanical compression is caused by a spring acting between the heat sink and the printed circuit board.

8. The method recited in claim 7, wherein high melting temperature solder is nominally 90/10 of lead/tin.

9. The method recited in claim 8, wherein second cross-sectional area solder columns are connected to transmit electrical signals between the pads on the substrate and on the printed circuit board.

10. The method recited in claim 9, wherein low melting temperature solder is nominally 37/63 of lead/tin.

* * * * *